United States Patent
Hamada

[11] Patent Number: 5,972,778
[45] Date of Patent: Oct. 26, 1999

[54] METHOD OF FABRICATING SEMICONDUCTOR DEVICE

[75] Inventor: Masayuki Hamada, Tokyo, Japan

[73] Assignee: NEC Corporation, Tokyo, Japan

[21] Appl. No.: 08/767,713

[22] Filed: Dec. 17, 1996

Related U.S. Application Data

[63] Continuation of application No. 08/490,562, Jun. 15, 1995, abandoned.

[30] Foreign Application Priority Data

Jun. 24, 1994 [JP] Japan ................................ 6-166392

[51] Int. Cl.⁶ .................................................. H01L 21/76
[52] U.S. Cl. .......................... 438/444; 438/439; 438/447; 438/425
[58] Field of Search ..................... 437/69, 70; 438/439, 438/444, 443, 445, 447, 425

[56] References Cited

U.S. PATENT DOCUMENTS

| | | | |
|---|---|---|---|
| 4,965,221 | 10/1990 | Dennison et al. | 437/72 |
| 5,137,843 | 8/1992 | Kim et al. | 437/72 |
| 5,173,444 | 12/1992 | Karamura | 437/69 |
| 5,246,537 | 9/1993 | Cooper et al. | 437/69 |
| 5,374,584 | 12/1994 | Lee et al. | 437/70 |

FOREIGN PATENT DOCUMENTS

| | | | |
|---|---|---|---|
| 0125845 | 5/1985 | Japan | 437/72 |
| 0174737 | 8/1986 | Japan | 437/72 |
| 0276343 | 12/1986 | Japan | 437/70 |
| 0202934 | 8/1988 | Japan | 437/70 |
| 63-217640 | 9/1988 | Japan . | |
| 0253640 | 10/1988 | Japan | 437/72 |
| 0067938 | 3/1989 | Japan | 437/72 |
| 2-119137 | 5/1990 | Japan . | |
| 4-58532 | 2/1992 | Japan . | |

*Primary Examiner*—Trung Dang
*Attorney, Agent, or Firm*—Young & Thompson

[57] ABSTRACT

A method of fabricating a semiconductor device, including the steps of (a) forming a channel at a surface of a semiconductor substrate only in the center of a region X which physically and electrically isolates adjacent regions Y in each of which a device is to be fabricated, and (b) forming a silicon oxide layer over the region X for physically and electrically isolating the adjacent regions Y from each other. The method suppresses dimensional shift and occurrence of a stress, and further makes it difficult for the reverse narrow channel effect to occur only by adding the small number of additional steps thereto.

19 Claims, 5 Drawing Sheets

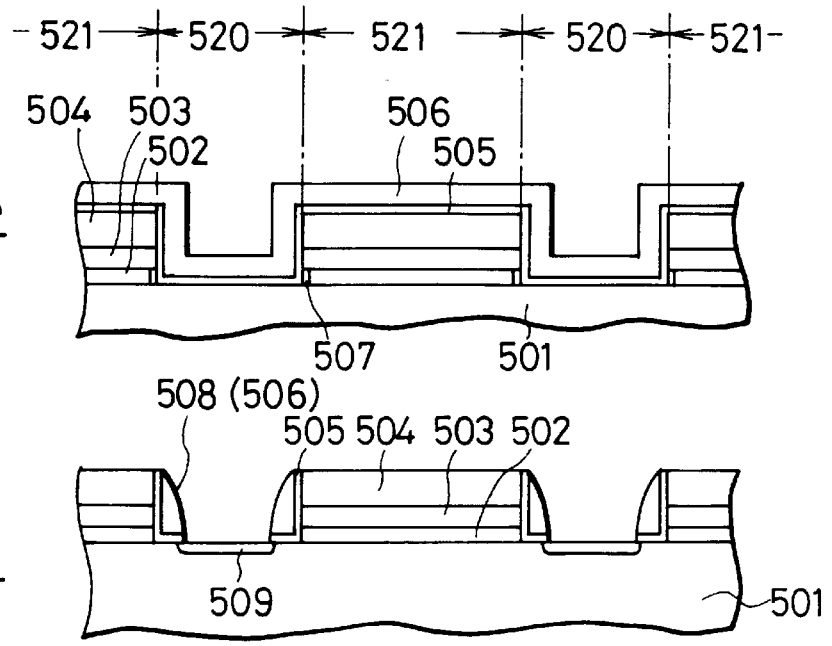
FIG. 3A PRIOR ART
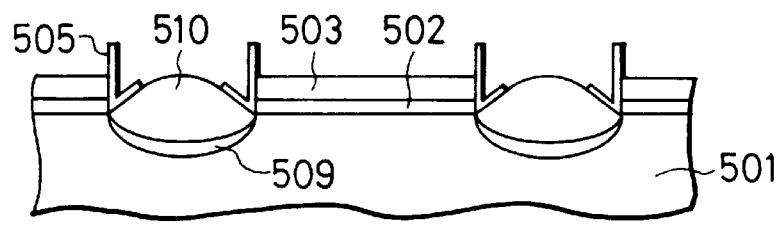
FIG. 3B PRIOR ART
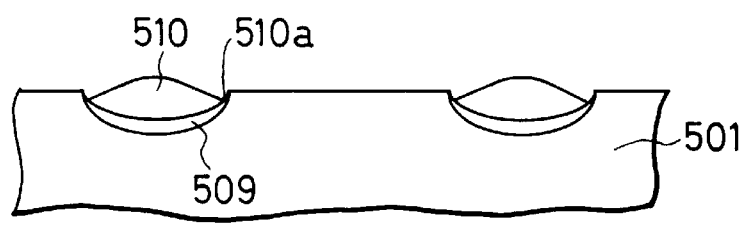
FIG. 3C PRIOR ART
FIG. 3D PRIOR ART

METHOD OF FABRICATING SEMICONDUCTOR DEVICE

This is a File Wrapper Continuation of U.S. patent application Ser. No. 08/490,562, filed Jun. 15, 1995 abandoned.

BACKGROUND OF THE INVENTION

1. Field of the Invention

The invention relates to a method of fabricating a semiconductor device, and more particularly to such a method using local oxidation to thereby physically and electrically isolate regions from each other in which a device is to be fabricated.

2. Description of the Related Art

Several proposals have been made in order to prevent dimensional shift and decrease stress for a semiconductor fabricating process in which local oxidation is to be used for physical separation of regions in which a device is to be fabricated. Hereinbelow will be explained some of such proposals as prior art.

Japanese Unexamined Patent Public Disclosure No. 2-119137 has suggested a method for fabricating a MOS transistor. In this method, as illustrated in FIG. 1A, on a silicon substrate 301 is deposited a silicon oxide layer 302, then a silicon nitride layer 303 on the silicon oxide layer 302, and further a photoresist mask 304 on the silicon nitride layer 303. Then, the silicon nitride layer 303 together with the silicon oxide layer 302 are selectively removed by means of anisotropic etching, and at the same time are formed channels 305. Then, ion-implantation is carried out to the channels 305 to thereby form channel stopper layers 306.

Then, as illustrated in FIG. 1B, oxidation is selectively carried out with the silicon nitride layer 303 serving as a mask to thereby form oxide layers 307 in the channels 305, which physically and electrically isolates regions 320 from each other in which a device is to be fabricated. Then, both the silicon oxide layer 302 and the silicon nitride layer 303 are removed. Finally, the oxide layers 307 and the exposed silicon substrate 301 are covered with a gate oxide layer 308, which is in turn covered with a gate interconnection 309. Thus, a MOS transistor is completed.

Japanese Unexamined Patent Public Disclosure No. 63-217640 has also suggested a semiconductor fabricating method. In this method, as illustrated in FIG. 2A, on a silicon substrate 401 are successively deposited a silicon oxide layer 402, a polysilicon layer 403 and a silicon nitride layer 404 in this order. Then, the silicon nitride layer 404, the polysilicon layer 403 and the silicon oxide layer 402 are selectively removed by etching, thereby these layers 404, 403 and 402 do not exist in regions 410 which physically and electrically isolate regions 411 from each other in which a device is to be fabricated. Then, the exposed silicon substrate 401 is oxidized to thereby thin silicon oxide layers 405 within the regions 410.

Then, a silicon nitride layer 406 is deposited over the thin silicon oxide layers 405 within the regions 410. Then, as illustrated in FIG. 2B, the silicon nitride layer 406 is etched so that the silicon nitride layer 406 remains only along sidewalls of the deposited layers 402, 403 and 404. As a result, the polysilicon layer 403 is entirely covered with the silicon nitride layers 404 and 406. Then, regions in which no polysilicon layer exists are oxidized with the polysilicon layer 403 covered with the silicon nitride layers 404 and 406 serving as a mask, as illustrated in FIG. 2C. Thus, as illustrated in FIG. 2D, there are formed oxide layers 407 serving as regions which physically and electrically isolate active regions 408 in which a device is to be fabricated.

Japanese Unexamined Patent Public Disclosure No. 4-58532 has suggested another method of fabricating a semiconductor device. In this method, as illustrated in FIG. 3A, on a silicon substrate 501 are successively deposited a silicon oxide layer 502, a silicon nitride layer 503 and a silicon oxide layer 504 in this order. Then, the silicon nitride layer 503 and the silicon oxide layer 504 are etched only in regions 520 which will physically and electrically isolate regions 521 from each other in which a device is to be fabricated, so that a reduced thickness of the silicon oxide layer 502 remains. Then, the thus residual silicon oxide layer 502 is etched by means of wet etching, by which is also formed spaces 507 having a length of approximately 100 angstroms, beneath the silicon nitride layer 503. Then, a resultant is entirely covered with a silicon nitride layer 505 for use of off-set formation, which is further entirely covered with a silicon oxide layer or an HTO layer 506, as illustrated in FIG. 3A.

Then, as illustrated in FIG. 3B, the HTO layer 506 and the silicon nitride layer 505 are back-etched to thereby form sidewalls 508 along the deposited layers 502, 503 and 504. Then, ion is implanted to the exposed silicon substrate 501 to thereby form impurity layers 509. Then, the sidewalls 508 composed of the silicon oxide layer 506, and the silicon oxide layer 504 are removed, as illustrated in FIG. 3C, and then there are formed oxide layers 510 which physically and electrically isolate the regions 521 from each other in which a device is to be fabricated, as illustrated in FIG. 3C. Finally, as illustrated in FIG. 3D, the silicon nitride layer 505, the silicon nitride layer 503 and the silicon oxide layer 502 are removed.

The first mentioned prior art has just a one step more than than LOCOS separation, specifically, a step of etching a silicon substrate. However, the selective oxidation causes dimensional shift because sidewalls 301a of the silicon substrate 301 in the channels 305 are also oxidized. In addition, the oxide layers 307 for isolating the regions 320 from each other are formed to be a barrel in shape, and thereby electric field is concentrated to ends 310 of the channels 305 with the result that a threshold voltage of a fine transistor is lowered. Thus, the firstly mentioned prior art has a problem like this which is so-called reverse narrow channel effect.

In the second mentioned prior art, a stress can be relaxed to some degree by forming the silicon oxide layer 405 beneath the silicon nitride layer 406, however, the number of steps is increased because there are additionally required the steps of forming the silicon oxide layer 405, forming the silicon nitride layer 406 and carrying out etching back. In addition, though the silicon oxide layer 405 can relax a stress to some degree when the oxide layers 407 are formed, the relaxation of stress is not sufficient because the dimensional shift is suppressed by the silicon nitride layer 406. Furthermore, similar to the first mentioned prior art, the second mentioned prior art has also a problem of the reverse narrow channel effect because the oxide layers 407 are formed to be a barrel in shape.

The third mentioned prior art makes it possible to relax a stress to some degree by forming the spaces 507. However, the method is required to have additional steps such as steps of etching in order to form the spaces 507, forming the silicon nitride layers 505 and the silicon oxide layers 506, and etching-back the layers. In addition, this method has smaller ability of physical separation of regions in which a device is to be fabricated than the other methods because the silicon substrate 501 is not etched. Furthermore, when a surface step of the silicon substrate 501 is intended to be made smaller after the formation of the oxide layers 510, ends 510a of the field oxide layers 510 are sunk below the surface of the silicon substrate 501, as illustrated in FIG. 3D. Similar to the first and second mentioned prior arts, the third mentioned prior art has also a problem of the reverse narrow channel effect.

Thus, the conventional art cannot simultaneously solve the problems of the relaxation of a stress, the dimensional shift, the increase of the number of fabrication steps, and the reverse narrow channel effect.

SUMMARY OF THE INVENTION

It is an object of the present invention to provide a method of fabricating a semiconductor device, which suppresses dimensional shift and occurrence of stress, and further makes it difficult for the reverse narrow channel effect to occur and requires adding only a small number of additional steps thereto.

The invention provides a method of fabricating a semiconductor device, including the steps of (a) forming a channel at a surface of a semiconductor substrate only in the center of a region X which physically and electrically isolates adjacent regions Y in each of which a device is to be fabricated, and (b) forming a silicon oxide layer A over the region X for physically and electrically isolating the adjacent regions Y from each other.

In a preferred embodiment, the silicon oxide layer A is formed by means of local oxidation.

In another preferred embodiment, the channel has a depth ranging from approximately 200 angstroms to approximately 1500 angstroms both inclusive.

In still another preferred embodiment, the silicon oxide layer A is formed by means of thermal oxidation at a temperature in the range of 750 to 1200 degrees centigrade both inclusive in hydrogen and oxygen atmosphere.

In yet another preferred embodiment, the silicon oxide layer A is formed by means of thermal oxidation at a temperature of at least 1050 degrees centigrade.

In still yet another preferred embodiment, the method further includes the step of (c) ion-implanting to the region X, subsequent to the step (a) and prior to the step (b). The step of (c) ion-implanting to the region X may be placed subsequent to the step (b).

The invention further provides a method of fabricating a semiconductor device, including the steps of (a) depositing a silicon oxide layer B on a semiconductor substrate, (b) depositing a silicon nitride layer on the silicon oxide layer, (c) removing a portion of both the silicon oxide layer B and the silicon nitride layer located in a region X which physically and electrically isolates adjacent regions Y in each of which a device is to be fabricated, (d) depositing a silicon oxide layer C all over the semiconductor substrate, (e) etching back the silicon oxide layer C to thereby form sidewalls, (f) etching the semiconductor substrate with both the sidewalls and the silicon nitride layer serving as a mask, thereby forming a channel in the region X, and (g) forming a silicon oxide layer A over the region X for physically and electrically isolating the adjacent regions Y to each other.

In a preferred embodiment, the silicon oxide layer A is formed by means of local oxidation.

In another preferred embodiment, the silicon oxide layer C deposited in the step (d) has a thickness of at least 500 angstroms.

In still another preferred embodiment, the etching back in the step (e) is carried out by anisotropic dry etching.

In yet another preferred embodiment, the channel has a depth ranging from approximately 200 angstroms to approximately 1500 angstroms both inclusive.

In still yet another preferred embodiment, the silicon oxide layer A is formed by means of thermal oxidation at a temperature in the range of 750 to 1200 degrees centigrade both inclusive in hydrogen and oxygen atmosphere.

In a further preferred embodiment, the silicon oxide layer A is formed by means of thermal oxidation at a temperature of at least 1050 degrees centigrade.

In still further preferred embodiment, the method further includes the step of (h) ion-implanting to the region X subsequent to the step (f) and prior to the step (g). The step (h) of ion-implanting to the region X may be placed subsequent to the step (g).

The advantages obtained by the aforementioned present invention will be described hereinbelow.

As having been described, in the method of fabricating a semiconductor device in accordance with the invention, channels are first formed at the center of regions which will physically and electrically isolate regions from each other in which a device is to be fabricated, and then silicon oxide layers are formed to physically and electrically isolate regions from each other in which a device is to be fabricated. Thus, it is possible to reduce the dimensional shift, and to form the above mentioned silicon oxide layers so that they are not barrel shaped, thereby making it difficult for the reverse narrow channel effect to occur. In addition, there occurs a smaller stress than prior art because the dimensional shift is not suppressed by silicon nitride layers and the like. In comparison with the conventional LOCOS separation process, the method in accordance with the invention requires three additional steps, namely the steps of depositing a silicon oxide layer, etching back, and etching a semiconductor substrate. Thus, the method suppresses the dimensional shift and occurrence of a stress, and further makes it difffcult for the reverse narrow channel effect to occur only by adding the small number of additional steps thereto.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 3A, 3B, 3C and 3D are cross-sectional views of a semiconductor device, showing the successive steps of still another prior art for fabricating a semiconductor device.

DESCRIPTION OF THE PREFERRED EMBODIMENTS

Preferred embodiments in accordance with the present invention will be explained hereinbelow with reference to the drawings.

[Embodiment 1]

Figure 1A:
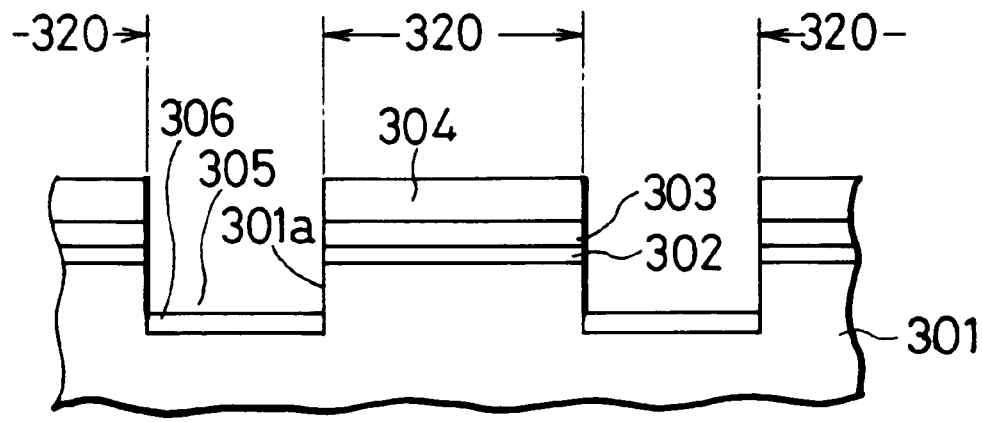
FIGS. 1A and 1B are cross-sectional views of a semiconductor device, showing the successive steps of prior art for fabricating a semiconductor device.
Figure 1B:
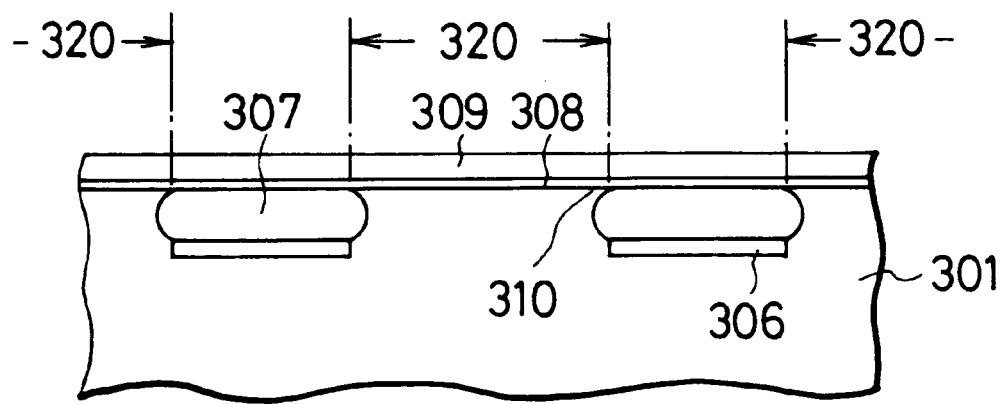
Figures 2A, 2B, 2C, 2D:
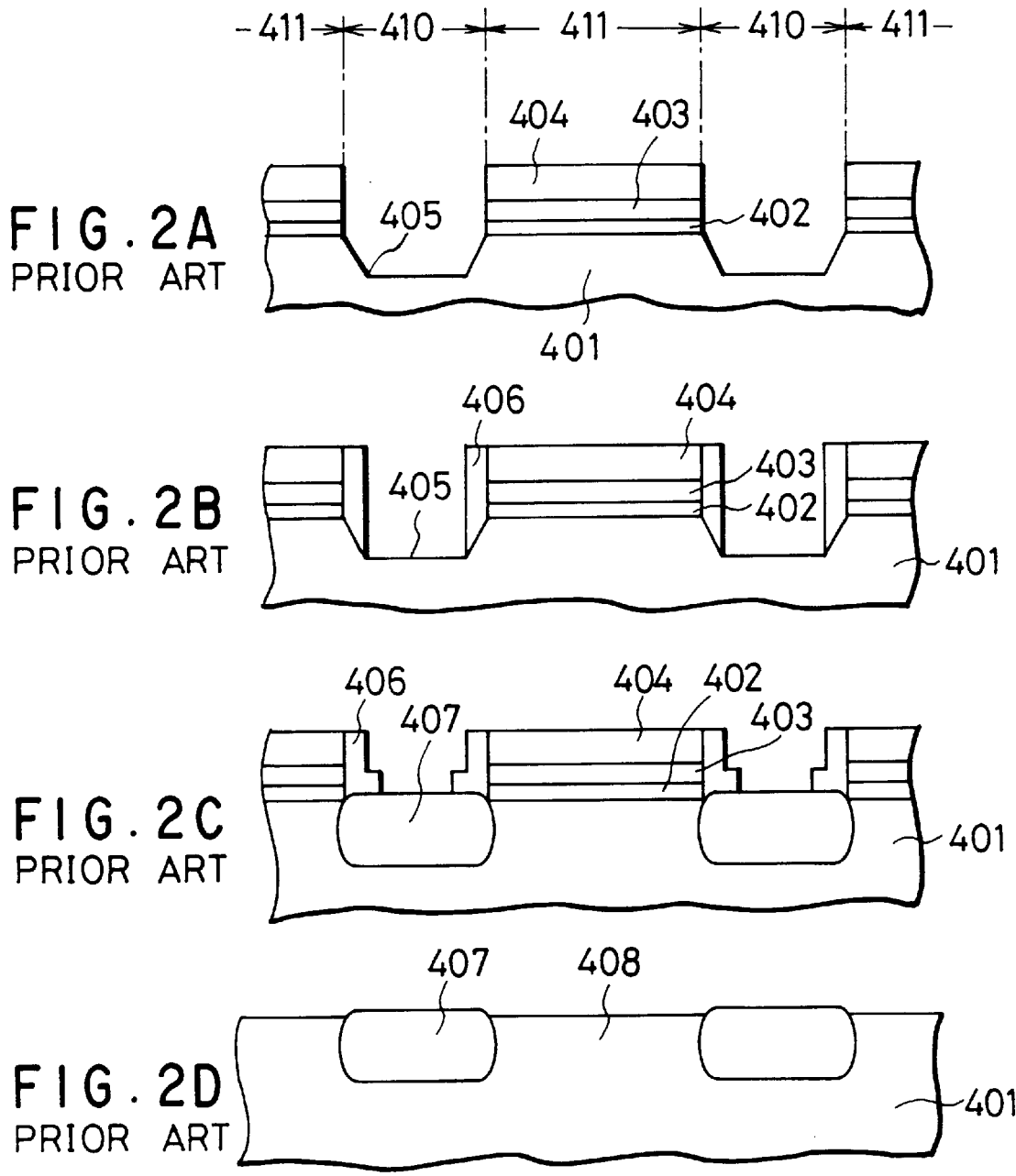
FIGS. 2A, 2B, 2C and 2D are cross sectional views of a semiconductor device, showing the successive steps of another prior art for fabricating a semiconductor device.
Figure 4A:
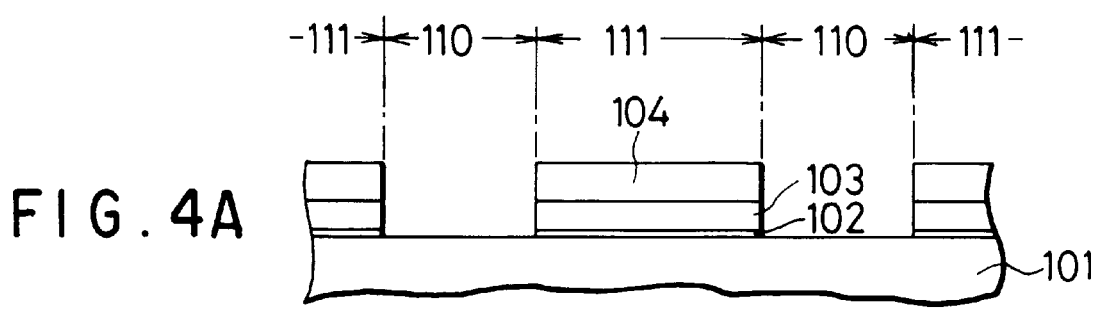
FIGS. 4A, 4B, 4C, 4D and 4E are cross-sectional views of a semiconductor device, showing the successive steps of the method of a fabricating a semiconductor device in accordance with the first embodiment of the present invention.

FIGS. 4A to 4E illustrate a first embodiment in accordance with the invention. As illustrated in FIG. 4A, on a silicon substrate 101 is deposited a silicon oxide layer 102, and on the silicon oxide layer 102 is deposited a silicon nitride layer 103. After the silicon nitride layer 103 has been entirely covered with a photoresist 104, a part of the photoresist 104 is removed in regions 110 which physically and electrically isolate regions 111 in which a device is to be fabricated. Then, the silicon nitride layer 103 and the silicon oxide layer 102 are etched with the residual photoresist 104 serving as a mask.

Figure 4B:
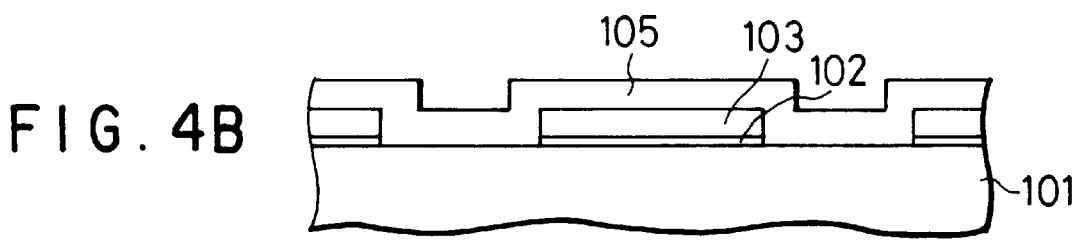

Then, as illustrated in FIG. 4B, a silicon oxide layer 105 is deposited over the silicon nitride layer 103 and the exposed silicon substrate 101. The silicon oxide layer 105 has a thickness of at least 500 angstroms.

Figure 4C:
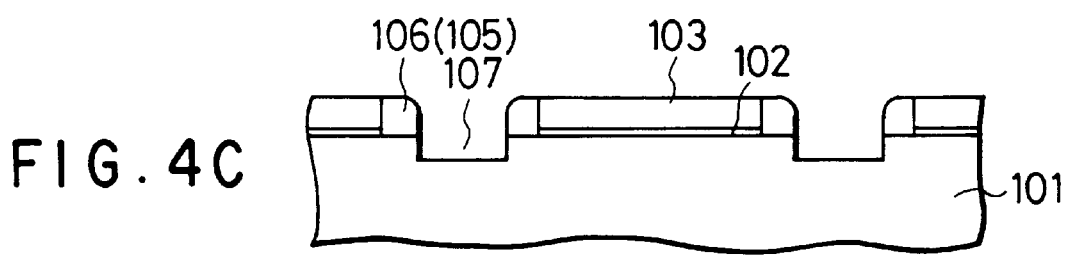

Then, the silicon oxide layer 105 is etched back by means of anisotropic dry etching to hereby form sidewalls 106, and subsequently the silicon substrate 101 is etched in the regions 110 to thereby form channels 107, as illustrated in FIG. 4C. The thus formed channels 107 have a depth in the range of 200 to 1500 angstroms both inclusive.

Figure 4D:
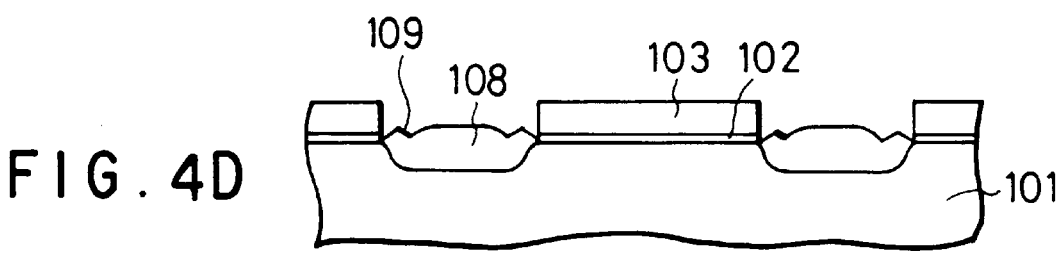

Then, the sidewalls 106 are removed by means of wet etching, and subsequently a resultant is subject to thermal oxidation at a temperature in the range of 750 to 1200 degrees centigrade both inclusive in hydrogen ($H_2$) and oxygen ($O_2$) atmosphere to thereby form silicon oxide layers 108 for physically and electrically isolating the regions 111 in which a device is to be fabricated, as illustrated in FIG. 4D. As seen in FIG. 4D, the silicon oxide layers 108 have bird's heads 109 at opposite ends thereof.

Figure 4E:
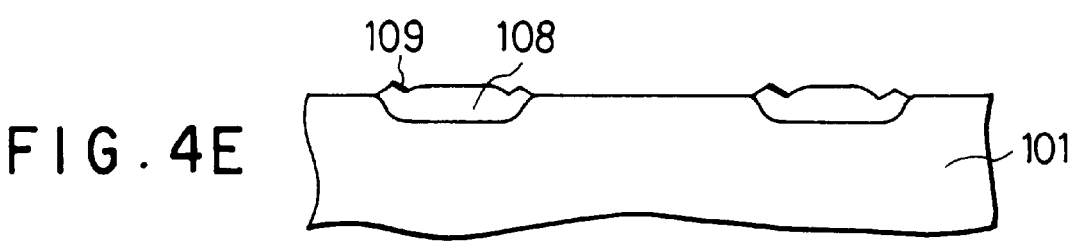

Then, the silicon oxide layer 102 and the silicon nitride layer 103 are removed by means of wet etching, as illustrated in FIG. 4E. As is obvious in FIG. 4E, the bird' heads 109 of the silicon oxide layer 108 are made smaller due to the wet etching.

Though not illustrated in FIGS. 4A to 4E, ion-implantation may be carried out subsequent to the formation of the channels 107 in order to prevent surface inversion in the regions 110. Alternatively, ion-implantation to the regions 110 may be carried out after the silicon oxide layers 108 have been deposited.

[Embodiment 2]

FIGS. 5A to 5E illustrate a second embodiment in accordance with the invention. As having been described in the first embodiment with reference to FIG. 4D, formation of bird's heads 109 at the opposite ends of silicon oxide layers 108 is unavoidable. The second embodiment can reduce the bird's heads 109 in size.

Figure 5A:
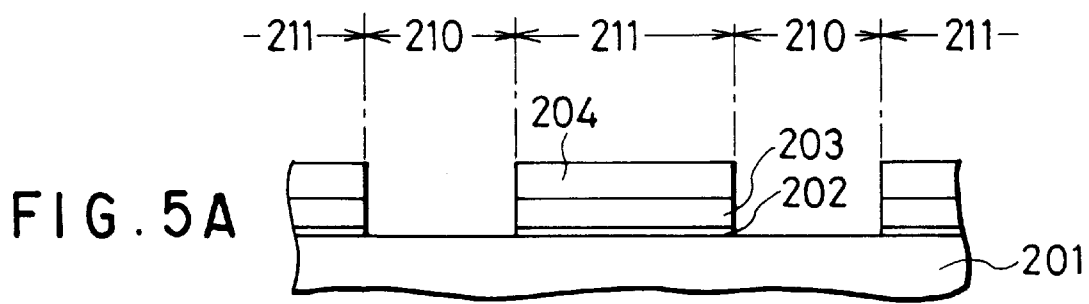
FIGS. 5A, 5B, 5C, 5D and 5E are cross-sectional views of a semiconductor device, showing the successive steps of the method of a fabricating a semiconductor device in accordance with the second embodiment of the present invention.

As illustrated in FIG. 5A, on a silicon substrate 201 is deposited a silicon oxide layer 202, and on the silicon oxide layer 202 is deposited a silicon nitride layer 203. After the silicon nitride layer 203 has been entirely covered with a photoresist 204, a part of the photoresist 204 is removed in regions 210 which physically and electrically isolate regions 211 in which a device is to be fabricated. Then, the silicon nitride layer 203 and the silicon oxide layer 202 are etched with the residual photoresist 204 serving as a mask.

Figure 5B:
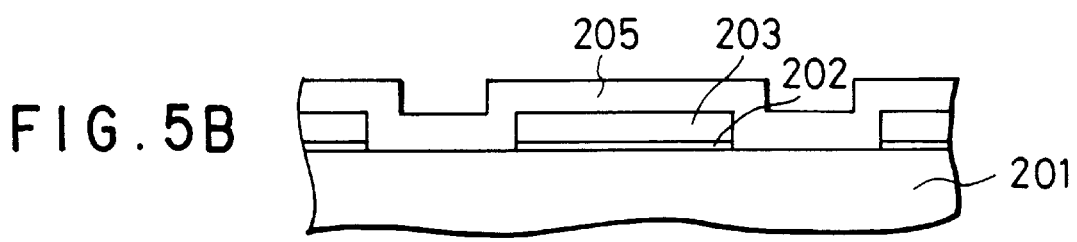

Then, as illustrated in FIG. 5B, a silicon oxide layer 205 is deposited over the silicon nitride layer 203 and the exposed silicon substrate 201. The silicon oxide layer 205 has a thickness of at least 500 angstroms.

Figure 5C:
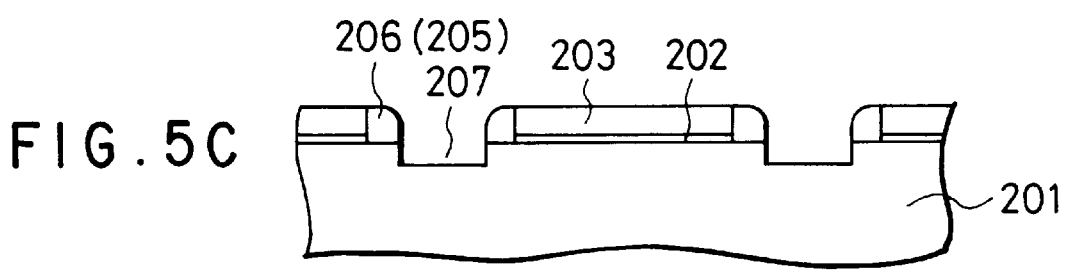

Then, the silicon oxide layer 205 is etched back by means of anisotropic dry etching to thereby form sidewalls 206, and subsequently the silicon substrate 201 is further etched in the regions 210 to thereby form channels 207, as illustrated in FIG. 5C. The thus formed channels 207 have a depth in the range of 200 to 1500 angstroms both inclusive.

Figure 5D:
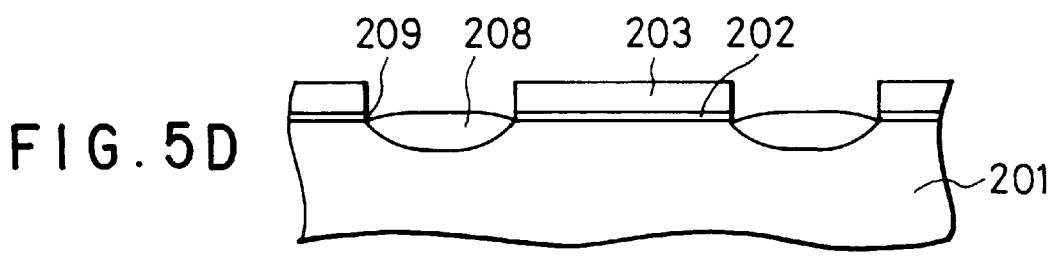
Figure 5E:
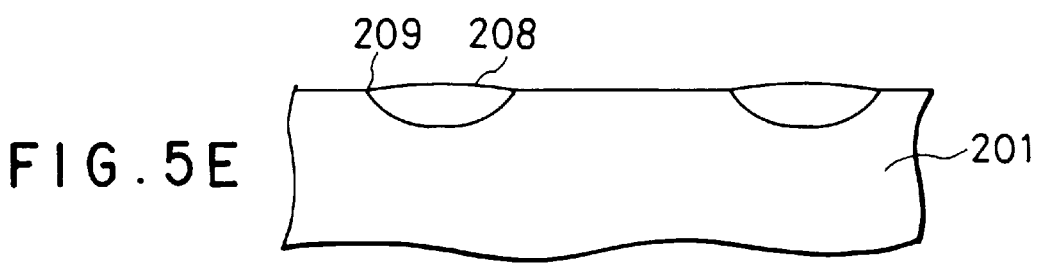

Then, the sidewalls 206 are removed by means of wet etching, and subsequently a resultant is subject to thermal oxidation at a temperature of at least 1050 degrees centigrade in hydrogen ($H_2$) and oxygen ($O_2$) atmosphere to thereby form silicon oxide layers 208 for physically and electrically isolating the regions 211 in which a device is to be fabricated, as illustrated in FIG. 5D. As seen in FIG. 5D, the thermal oxidation at a temperature of at least 1050 degrees centigrade raises the viscosity of the silicon oxide layers 208 with the result of the formation of smaller bird's heads 209 of the silicon oxide layers 208 than those of the silicon oxide layers 108 (see FIG. 4D) formed in the first embodiment Then, the silicon oxide layer 202 and the silicon nitride layer 203 are removed by means of wet etching, as illustrated in FIG. 5E. As is obvious in FIG. 5E, the bird's heads 209 of the silicon oxide layer 208 are made considerably lower than the bird's heads 109 in the first embodiment, resulting in that the bird's heads 209 are almost not raised above the surface of the silicon substrate 201.

Similarly to the first embodiment, in the second embodiment, a step of ion-implantation may be placed either subsequent to the formation of the channels 207 or after the silicon oxide layers 208 have been deposited, in order to prevent surface inversion in the regions 210.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps, in sequence of:
    (a) forming a first silicon dioxide layer on a substrate;
    (b) forming a silicon nitride layer on the first silicon dioxide layer;
    (c) forming a region by removing a portion of both the first silicon dioxide layer and the silicon nitride layer so that a portion of the substrate is exposed;
    (d) forming a second silicon dioxide layer over the silicon nitride layer and the exposed portion of the substrate;
    (e) forming sidewalls bordering the region by etching back the second silicon dioxide layer;
    (f) forming a channel at the center of the region by etching the substrate using the sidewalls and the silicon nitride film as a mask so that the channel is narrower than the region;
    (g) removing the sidewalls; and
    (h) forming an isolation region that is no wider than the region and does not extend beneath the first silicon dioxide layer by thermally oxidizing the exposed substrate.

2. The method of claim 1, wherein step (h) is carried out by local oxidation.

3. The method of claim 1, wherein the second silicon dioxide layer has a thickness of at least about 500 angstroms.

4. The method of claim 1, wherein the channel has a depth ranging from about 200 to 1500 angstroms.

5. The method of claim 1, wherein step (h) is carried out at a temperature in the range of about 750 to 1200 degrees centigrade in a hydrogen and oxygen atmosphere.

6. The method of claim 1, wherein step (h) is carried out at a temperature of at least 1050 about degrees centigrade.

7. The method of claim 4, wherein step (h) is carried out at a temperature in the range of about 750 to 1200 degrees centigrade in a hydrogen and oxygen atmosphere.

8. The method of claim 4, wherein step (h) is carried out at a temperature of at least about 1050 degrees centigrade.

9. The method of claim 1, further comprising the step of ion-implanting the region after step (f) and prior to step (h).

10. The method of claim 1, further comprising the step of ion-implanting the isolation region after step (h).

11. The method as recited in claim 9, wherein the channel is formed so that it has a depth ranging from about 200 to 1500 angstroms.

12. The method of claim 10, wherein the channel is formed so that it has a depth ranging from about 200 to 1500 angstroms.

13. A method of fabricating a semiconductor device, comprising the steps of, in sequence, of:

(a) forming a first insulating layer on a substrate;

(b) removing said first insulating layer to expose a surface of said substrate;

(c) forming a second insulating layer on said first insulating layer;

(d) removing said second insulating layer except for a portion thereof formed on said sidewall of said first insulating layer;

(e) forming a channel by etching the substrate using said portion of said second insulating layer as a mask;

(f) removing said portion of said second insulating layer; and (g) forming a third insulating layer that is no wider than a portion of the substrate that is exposed in said step (b) and does not extend beneath the first insulating layer by thermally oxidizing the exposed substrate.

14. The method of claim 13, wherein said third insulating layer is formed by local oxidation in said step (g).

15. The method of claim 13, wherein said channel has a depth ranging from about 200 to about 1500 angstroms.

16. The method of claim 14, wherein said local oxidation is carried out at a temperature in the range of about 750 to 1200° C. in a hydrogen and oxygen atmosphere.

17. The method of claim 14, wherein said local oxidation is carried out at a temperature of at least about 1050° C.

18. The method of claim 13 further comprising the step of ion-implanting said exposed surface after said step (e) but prior to said step (g).

19. The method of claim 13 further comprising the step of ion-implanting said third insulating layer after said step (g).

* * * * *